(12) United States Patent
Mohammed et al.

(10) Patent No.: US 8,314,487 B2
(45) Date of Patent: Nov. 20, 2012

(54) FLANGE FOR SEMICONDUCTOR DIE

(75) Inventors: Anwar A. Mohammed, San Jose, CA (US); Soon Ing Chew, Milpitas, CA (US); Donald Fowlkes, San Jose, CA (US); Alexander Komposch, Morgan Hill, CA (US); Benjamin Pain-Fong Law, Fremont, CA (US); Michael Opiz Real, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 349 days.

(21) Appl. No.: 12/641,496

(22) Filed: Dec. 18, 2009

(65) Prior Publication Data

US 2011/0147921 A1    Jun. 23, 2011

(51) Int. Cl.
    *H01L 23/34* (2006.01)
(52) U.S. Cl. ......... 257/723; 257/E21.499; 257/E23.003; 285/405; 29/832; 438/117; 72/379.2
(58) Field of Classification Search ................. 257/732, 257/723, E21.499, E23.003; 438/121, 123, 438/117; 285/405; 29/832; 72/379.2
See application file for complete search history.

(56) References Cited

U.S. PATENT DOCUMENTS

| | | | | |
|---|---|---|---|---|
| 4,575,038 A * | 3/1986 | Moore | ............................ | 248/505 |
| 5,541,525 A * | 7/1996 | Wood et al. | .............. | 324/756.02 |
| 5,600,540 A * | 2/1997 | Blomquist | ..................... | 361/704 |
| 5,639,990 A * | 6/1997 | Nishihara et al. | ............. | 174/527 |
| 5,671,118 A * | 9/1997 | Blomquist | ..................... | 361/704 |
| 6,243,264 B1 * | 6/2001 | Bollesen et al. | .............. | 361/704 |
| 6,259,602 B1 * | 7/2001 | Malhammar | .................. | 361/704 |
| 6,303,985 B1 * | 10/2001 | Larson et al. | .................. | 257/676 |
| 6,484,119 B1 * | 11/2002 | Kaneo et al. | ................... | 702/150 |
| 6,635,513 B2 * | 10/2003 | Hensley et al. | ............... | 438/117 |
| 6,699,730 B2 * | 3/2004 | Kim et al. | ...................... | 438/107 |
| 6,700,181 B1 | 3/2004 | Coccioli | | |
| 6,703,261 B2 * | 3/2004 | Ito | ................................. | 438/122 |
| 6,787,900 B2 | 9/2004 | Shinohara et al. | | |
| 6,867,367 B2 * | 3/2005 | Zimmerman | .................. | 174/528 |
| 6,903,698 B2 * | 6/2005 | Silva | ............................. | 343/713 |
| 7,053,299 B2 * | 5/2006 | Zimmerman | .................. | 174/528 |
| 7,632,716 B2 * | 12/2009 | Muraki et al. | ................. | 438/122 |
| 8,163,570 B2 * | 4/2012 | Castex et al. | ...................... | 438/5 |
| 2004/0160768 A1 * | 8/2004 | Cok | ............................... | 362/226 |

(Continued)

OTHER PUBLICATIONS

Mohammed et al., "High Power Ceramic on Copper Package," co-pending U.S. Appl. No. 12/436,652, filed May 6, 2009, pp. 1-24.

*Primary Examiner* — Fernando L Toledo
*Assistant Examiner* — Victoria K Hall
(74) *Attorney, Agent, or Firm* — Murphy, Bilak & Homiller, PLLC

(57) ABSTRACT

A semiconductor package includes a curved body and a plurality of semiconductor die. The curved body includes first and second opposing end regions and an intermediate center region. The curved body has a first inflection point at the center region, a second inflection point at the first end region and a third inflection point at the second end region. The center region has a convex curvature with a minimal extremum at the first inflection point, the first end region has a concave curvature with a maximal extremum at the second inflection point and the second end region has a concave curvature with a maximal extremum at the third inflection point. The plurality of semiconductor die are attached to an upper surface of the curved body between the maximal extrema.

18 Claims, 5 Drawing Sheets

U.S. PATENT DOCUMENTS

| | | | |
|---|---|---|---|
| 2004/0217461 A1* | 11/2004 | Damberg | 257/698 |
| 2005/0016750 A1* | 1/2005 | Zimmerman | 174/52.3 |
| 2009/0051018 A1* | 2/2009 | Moline | 257/675 |
| 2010/0283134 A1* | 11/2010 | Mohammed et al. | 257/675 |
| 2011/0134514 A1* | 6/2011 | Weibezahn et al. | 359/359 |
| 2012/0056205 A1* | 3/2012 | Allard et al. | 257/84 |

* cited by examiner

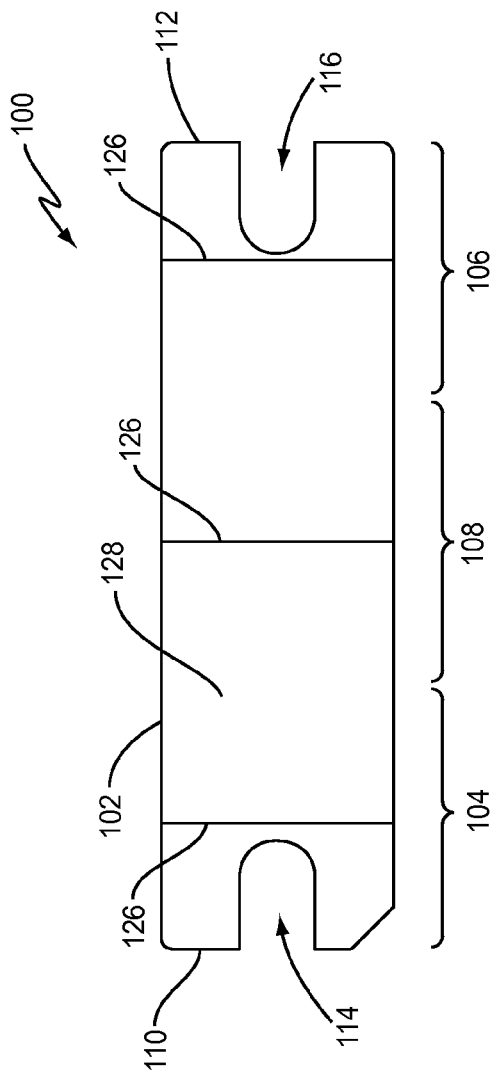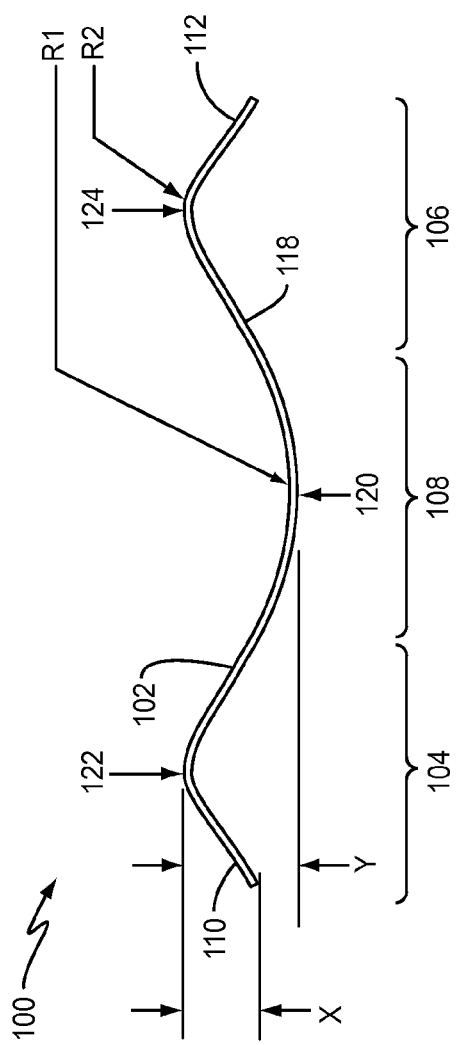

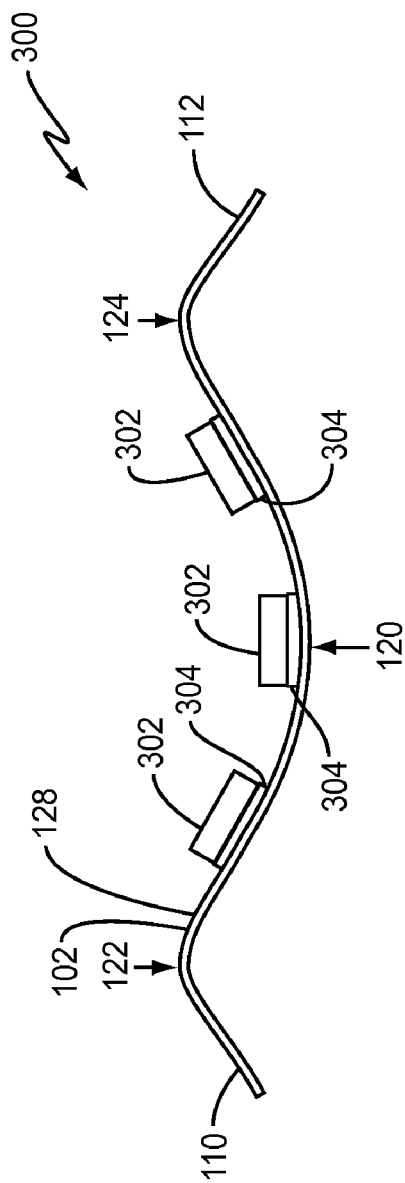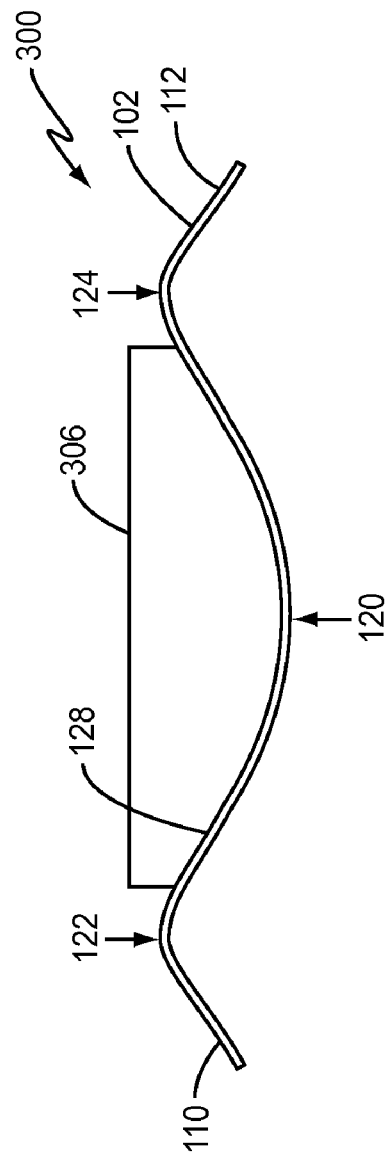

FLANGE FOR SEMICONDUCTOR DIE

BACKGROUND

Most power semiconductor packages use copper or alloyed copper heat sinks such as CuMoCu or CuW as the flange upon which power semiconductor die are attached. A lid is typically attached to the flange to enclose and protect the die. During the die attach, lid attach and other package assembly processes, the metallic flange typically becomes bowed. The bowing occurs as a result of CTE (coefficient of thermal expansion) mismatches between the semiconductor die and the metal flange, for example. Attaching a bowed flange to a circuit board results in poor thermal performance because the flange and circuit board are not in good surface contact with one another. Instead, there is a gap between the flange and the circuit board. Having a gap between the flange and the circuit board significantly decreases thermal performance of the overall assembly, which is particularly problematic for high power applications. Materials such as thermal grease and indium solder foils have been used to fill the gap between a bowed flange and a circuit board to which the flange is fastened. However, thermal performance still suffers appreciably even with the use of gap filler materials since the least restrictive thermal pathway is direct contact between the flange and the circuit board.

SUMMARY

According to an embodiment of a flange, the flange comprises a curved body having first and second opposing end regions and an intermediate center region. The curved body has a first inflection point at the center region, a second inflection point at the first end region and a third inflection point at the second end region. The center region has a convex curvature with a minimal extremum at the first inflection point, the first end region has a concave curvature with a maximal extremum at the second inflection point and the second end region has a concave curvature with a maximal extremum at the third inflection point.

According to an embodiment of a semiconductor package, the semiconductor package comprises a curved body including first and second opposing end regions and an intermediate center region. The curved body has a first inflection point at the center region, a second inflection point at the first end region and a third inflection point at the second end region. The center region has a convex curvature with a minimal extremum at the first inflection point, the first end region has a concave curvature with a maximal extremum at the second inflection point and the second end region has a concave curvature with a maximal extremum at the third inflection point. A plurality of semiconductor die are attached to an upper surface of the curved body between the maximal extrema.

According to an embodiment of a method of manufacturing a substrate assembly, the method includes providing a substrate having a relatively flat surface and placing a curved body on the relatively flat surface of the substrate. The curved body includes first and second opposing end regions curved in a first direction facing the substrate and an intermediate center region curved in a second direction facing away from the substrate. The curved body has a plurality of semiconductor die attached to an upper surface of the curved body facing away from the substrate. The method also includes bolting down the end regions of the curved body to the substrate so that a lower surface of the curved body flattens out and contacts the relatively flat surface of the substrate over a length of the curved body after bolting down.

Those skilled in the art will recognize additional features and advantages upon reading the following detailed description, and upon viewing the accompanying drawings.

BRIEF DESCRIPTION OF THE DRAWINGS

FIG. 1 is a plan view of an embodiment of a flange having a curved body for attaching semiconductor die.

FIG. 2 is a side view of the flange of FIG. 1.

FIG. 3 is a side view of an embodiment of a semiconductor package including a plurality of semiconductor die attached to an upper surface of the curved flange body of FIG. 1.

FIG. 4 is a side view of the semiconductor package of FIG. 3 with a lid attached to the upper surface of the curved flange body.

DETAILED DESCRIPTION

Figure 5:
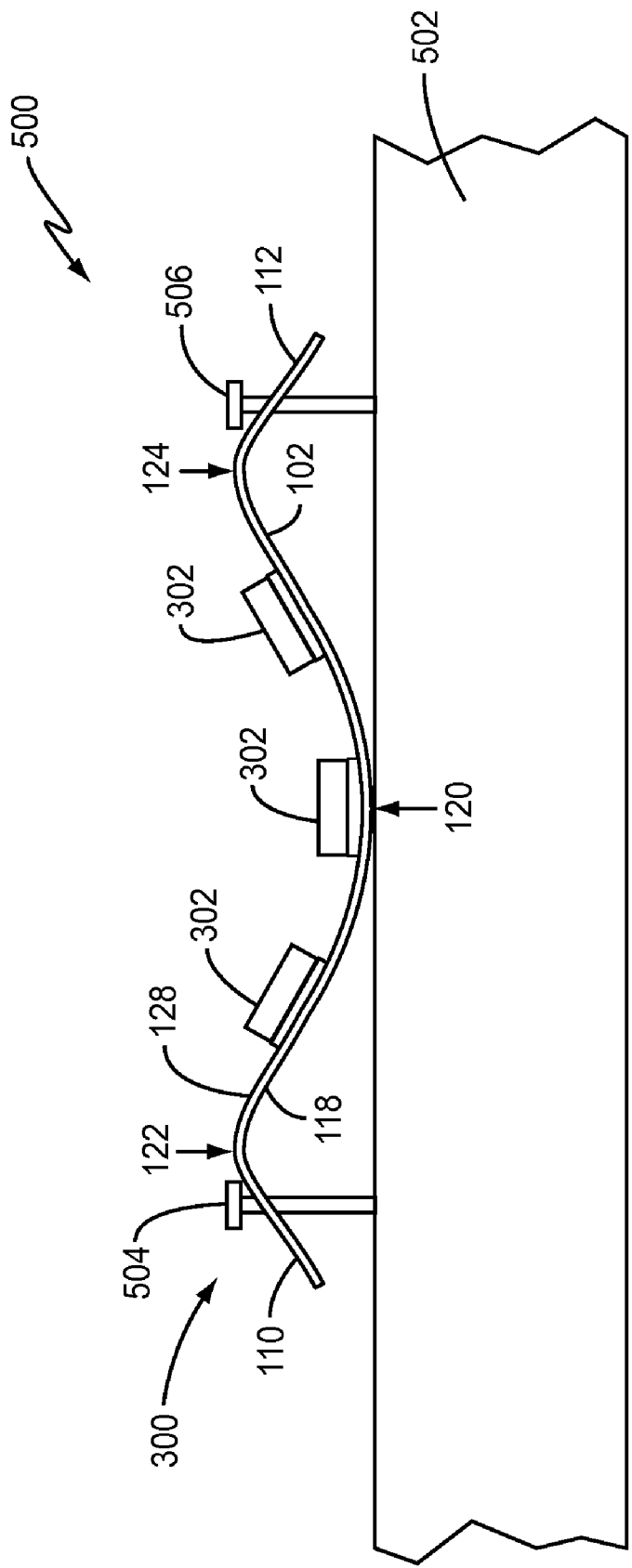
FIGS. 5-7 are side views of an embodiment of a substrate assembly including the semiconductor package of FIG. 3 during different phases of being attached to a substrate.

FIG. 1 illustrates a top-down plan view of an embodiment of a flange 100 for attaching semiconductor die. The flange 100 comprises a single continuous metallic curved body 102 including first and second opposing end regions 104, 106 and an intermediate center region 108. The flange 100 can be made from any type of metallic material such as copper or a copper alloy. For example, the flange 100 may comprise C19210 (K80), C19400, CuMoCu, CuW or any other suitable type of metallic material. The ends 110, 112 of the flange 100 have respective inlets or openings 114, 116 for receiving a bolt to fasten the flange 100 onto another component such as a circuit board (not shown in FIG. 1). The curved body 102 is intentionally curved prior to die attachment. The amount of curvature is a function of several variables, e.g. such as the die attach process parameters (e.g. temperature, duration, etc.), the lid attach process parameters (e.g. temperature, duration, etc.), parameters associated with other processes, the flange material, the die material, etc. The curvature imparted on the curved body 102 is selected so that the flange 100 becomes relatively flat when subsequently bolted down onto a substrate such as a heat sink or circuit board as will be described in more detail later herein. In one embodiment, the flange 100 is stamped to impart the desired curvature.

FIG. 2 is a side view of the flange 100, and illustrates an embodiment where the curved body 102 has a subtle M-shape. Imparting an M-shaped curve to the curved body 102 yields very good mechanical contact between the bottom surface 118 of the flange 100 and a substrate (not shown in FIG. 2) after bolt down. To achieve the final desired curvature just prior to substrate mounting, the flange 100 is bowed with a specific initial curvature which depends upon the materials, processes and the processing sequence utilized.

In more detail, the curved body 102 has a first inflection point 120 at the center region 108, a second inflection point 122 at the first end region 104 and a third inflection point 124 at the second end region 106. The center region 108 of the curved body 102 has a convex curvature with a minimal extremum at the first inflection point 120, the first end region 104 has a concave curvature with a maximal extremum at the second inflection point 122 and the second end region 106 has a concave curvature with a maximal extremum at the third inflection point 124.

Stamping the flange 100 to curve the body 102 leaves crimp marks 126 on the bottom and upper surfaces 118, 128 of the flange 100 at the minimal extremum 120 and the maximal extrema 122, 124 as shown in FIG. 1. The curved body 102 can be curved so that the minimal extremum 120 vertically extends beyond the ends 110, 112 of the flange 100 by a distance represented by y-x in FIG. 2. In some embodiments, x is in the range of 1 to 3 mils and y is in the range of 3 to 5 mils. In an embodiment, the ends 110, 112 of the flange 100 point downward to increase flange-to-circuit-board surface contact during assembly.

FIG. 2 shows the concave curvatures of the end regions 104, 106 having a smaller radius (R2) than the convex curvature (R1) of the center region 108. In one embodiment, the radius of the concave curvatures is about ⅙ the radius of the convex curvature. For example, R2 can be about 5 inches and R1 about 30 inches for a 40 mil thick flange. In some embodiments, the flange 100 is about 40 to 50 mils thick and the curved body 102 has a peak-to-peak height from the minimal extremum 120 to the maximal extrema 122, 124 of about 2 to 4 mils as represented by distance y in FIG. 2. Generally, the flange 100 can have any desired width, length and thickness. The curvature radii (R1, R2) and the peak-to-peak height (y) of the curved body 102 are a function of the flange dimensions, the materials, the processes and the processing sequence utilized as described above. The ideal flange curvature is modeled as a function of these parameters and/or other parameters that cause flange bowing during processing, and thus depends on several variables. After the desired curvature is imparted on the flange 100, semiconductor die can be attached to the flange 100.

FIG. 3 illustrates an embodiment of a semiconductor package 300 including a plurality of semiconductor die 302 attached to the upper surface 128 of the curved body 102. The semiconductor die 302 are attached to the curved body 102 between the maximal extrema 122, 124. The die 302 can be attached using any suitable type of die attach material 304 such as solder, epoxy, etc. For example, the die attach material 304 may be AuSn, AuSi, AuGe, etc. Other die attach materials may be used. The die attach process imparts some bowing on the curved body 102 due to the die attach temperature, duration, die attach material, etc. However, the curved body 102 still maintains the same overall curved shape imparted prior to die attach. Bowing caused during the die attach process is considered when selecting the initial curvature to impart on the flange 100 as described above.

FIG. 4 illustrates the semiconductor package 300 after an optional lid 306 is attached to the upper surface 128 of the curved body 102 between the maximal extrema 122, 124. The lid 306 encloses the semiconductor die 302. The lid 306 may be attached to the curved body 102 using an epoxy such as polyimide, or any other suitable material. A ceramic window frame that surrounds the die 302 may also be attached to the upper surface 128 of the curved body 102 between the lid 306 and the flange 100 for providing electrical connections. The lid and window frame attach processes impart additional bowing on the curved body 102 due to the lid attach temperature, duration, lid attach material, etc. However, the curved flange body continues maintains the same overall curved shape imparted prior to lid and die attach. Bowing caused during the lid and window frame attach processes is also considered when selecting the initial curvature to impart on the flange 100 as described above. The semiconductor package 300 is ready for attachment to a substrate such as a heat sink, a circuit board, a heat plug component of a circuit board, etc.

FIG. 5 illustrates an embodiment of a substrate assembly 500 during an initial phase of attaching the semiconductor package 300 to a substrate 502 such as a heat sink, a circuit board, a heat plug component of a circuit board, etc. The package 300 is shown without the optional lid 306 for ease of illustration. The upper surface of the substrate 502 is relatively flat. If the substrate 502 is a circuit board, the region of the circuit board to which the curved body 102 is to be mounted may include a copper or copper alloy heat slug for added heat dissipation. During the initial attachment phase, the convex curved center region of the curved body 102 is placed in contact with the substrate 502. That is, the first inflection point 120 at the center region 108 of the curved body 102 is placed in contact with the substrate 502. The ends 110, 112 of the curved body 102 point longitudinally outward or downward toward the substrate 502, but not upward. This way, the ends 110, 112 of the curved body 102 provide good downward pressure during flange attachment, forcing the curved body 102 to flatten out during bolting down. If the flange ends 110, 112 were to point upward away from the substrate 502, a lifting movement could occur during bolting down which would create an undesirable gap between the bottom surface 118 of the curved body 102 and the substrate 502. Bolts 504, 506 are placed through the inlets 114, 116 formed in each end 110, 112 of the curved body 102 for attaching the curved body 102 to the substrate 502.

Figure 6:
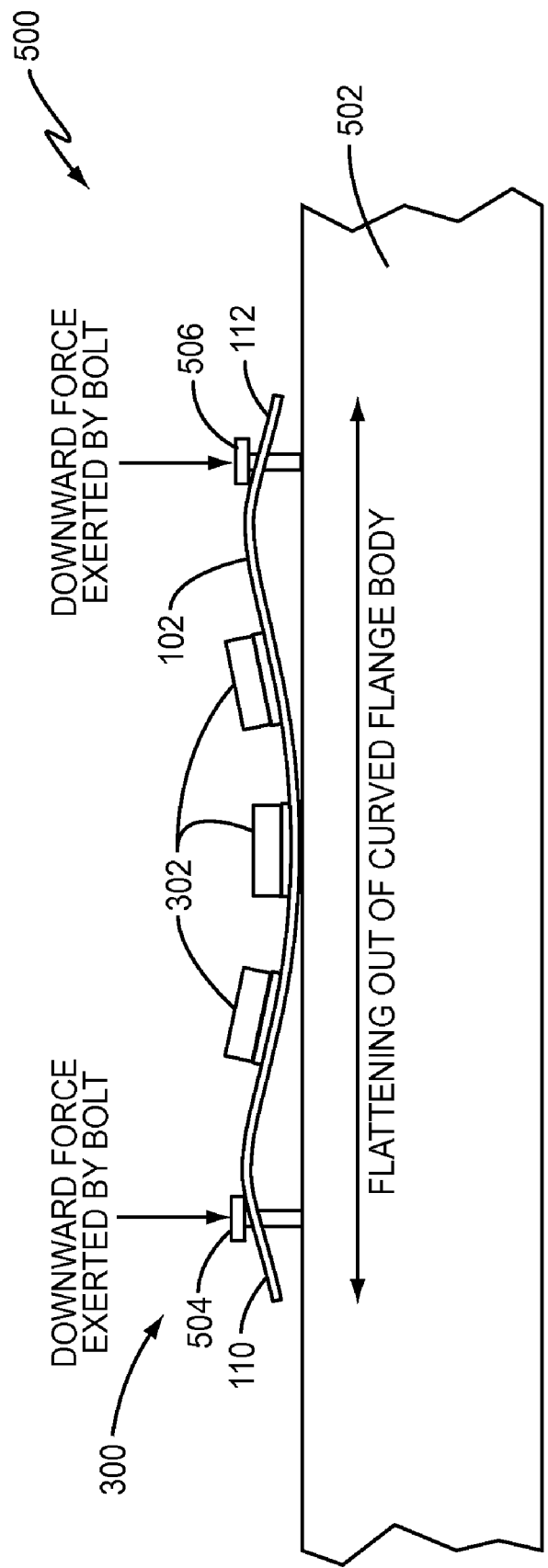

FIG. 6 illustrates the substrate assembly 500 during an intermediate phase of attaching the semiconductor package 300 to the substrate 502. During the intermediate attachment phase, the bolts 504, 506 are screwed into the substrate 502. In response, the curved body 102 begins to flatten out. Particularly, the ends 110, 112 of the curved body 102 provide downward pressure which forces the curved body 102 to flatten out during bolting down. As the curved body 102 continues to flatten, more of the bottom surface 118 of the curved body 102 comes into contact with the substrate 502.

Figure 7:
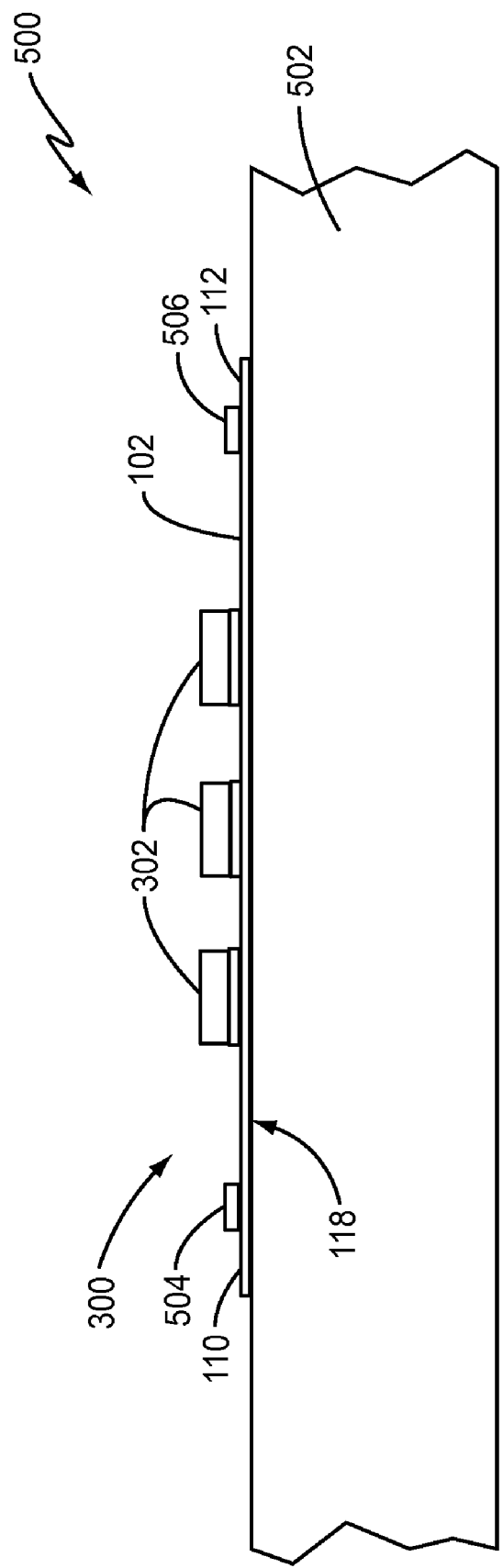

FIG. 7 illustrates the substrate assembly 500 during a final phase of attaching the semiconductor package 300 to the substrate 502. During the final attachment phase, the bolts 504, 506 are screwed into their final position in the substrate 502, causing the curved body 102 to become essentially flat. The entire bottom surface 118 of the curved body 102 is in direct contact with the substrate 502. As such, there is essentially no void between the curved body 102 and the substrate 502. Thus, no gap filler material is needed. Having essentially the entire bottom surface 118 of the curved body 102 in direct contact with the substrate 502 greatly enhances thermal performance of the substrate assembly 500.

In addition, the curved body 102 is elastic. As such, the curved body 102 returns to a curved shape after removal from the substrate 502. That is, the curved body 102 is made of a material that returns to its original shape after the stress which caused the flange body to deform (i.e. flatten out) is removed. Accordingly, the curved body 102 returns to its original curved shape in response to the bolts 504, 506 being removed from the substrate 502.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a substrate assembly, comprising:
   providing a substrate having a relatively flat surface;
   placing a curved body on the relatively flat surface of the substrate, the curved body including first and second opposing end regions curved in a first direction facing the substrate and an intermediate center region curved in a second direction facing away from the substrate, the curved body having a plurality of semiconductor die attached to an upper surface of the curved body facing away from the substrate; and
   bolting down the end regions of the curved body to the substrate so that a lower surface of the curved body flattens out and contacts the relatively flat surface of the substrate over a length of the curved body after bolting down.

2. The method of claim 1, wherein the opposing end regions of the curved body point downward toward the substrate prior to bolting down.

3. The method of claim 1, wherein the lower surface of the curved body is in direct contact with the relatively flat surface of the substrate after bolting down.

4. The method of claim 1, wherein the substrate is a circuit board.

5. The method of claim 1, further comprising stamping a single continuous metallic body to form the curved body with the center region having a convex curvature with a minimal extremum at a first inflection point, the first end region having a concave curvature with a maximal extremum at a second inflection point and the second end region having a concave curvature with a maximal extremum at a third inflection point.

6. The method of claim 5, comprising stamping the single continuous metallic body so that the minimal extremum extends vertically beyond opposing ends of the curved body.

7. The method of claim 5, comprising stamping the single continuous metallic body so that the opposing ends of the curved body point downward toward the substrate.

8. The method of claim 5, comprising stamping the single continuous metallic body so that each concave curvature has a smaller radius than the convex curvature.

9. The method of claim 8, comprising stamping the single continuous metallic body so that the radius of each concave curvature is about $\frac{1}{6}$ the radius of the convex curvature.

10. A method of manufacturing a substrate assembly, comprising:
    providing a substrate having a relatively flat surface;
    placing a curved body on the relatively flat surface of the substrate, the curved body including first and second opposing end regions curved in a first direction facing the substrate and an intermediate center region curved in a second direction facing away from the substrate, the curved body having a plurality of semiconductor die attached to an upper surface of the curved body facing away from the substrate; and
    fastening the curved body to the substrate so that a lower surface of the curved body flattens out and contacts the relatively flat surface of the substrate over a length of the curved body after fastening.

11. The method of claim 10, wherein the opposing end regions of the curved body point downward toward the substrate prior to fastening.

12. The method of claim 10, wherein the lower surface of the curved body is in direct contact with the relatively flat surface of the substrate after fastening.

13. The method of claim 10, wherein the substrate is a circuit board.

14. The method of claim 10, further comprising stamping a single continuous metallic body to form the curved body with the center region having a convex curvature with a minimal extremum at a first inflection point, the first end region having a concave curvature with a maximal extremum at a second inflection point and the second end region having a concave curvature with a maximal extremum at a third inflection point.

15. The method of claim 14, comprising stamping the single continuous metallic body so that the minimal extremum extends vertically beyond opposing ends of the curved body.

16. The method of claim 14, comprising stamping the single continuous metallic body so that the opposing ends of the curved body point downward toward the substrate.

17. The method of claim 14, comprising stamping the single continuous metallic body so that each concave curvature has a smaller radius than the convex curvature.

18. The method of claim 17, comprising stamping the single continuous metallic body so that the radius of each concave curvature is about $\frac{1}{6}$ the radius of the convex curvature.

* * * * *